(12) United States Patent
Kai et al.

(10) Patent No.: US 6,504,761 B2
(45) Date of Patent: Jan. 7, 2003

(54) NON-VOLATILE SEMICONDUCTOR MEMORY DEVICE IMPROVED SENSE AMPLIFICATION CONFIGURATION

(75) Inventors: Yoshihide Kai, Hyogo (JP); Atsushi Ohba, Hyogo (JP); Isao Nojiri, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/931,758

(22) Filed: Aug. 20, 2001

(65) Prior Publication Data

US 2002/0110021 A1 Aug. 15, 2002

(30) Foreign Application Priority Data

Feb. 13, 2001 (JP) ........................................ 2001-034864

(51) Int. Cl.$^7$ .............................................. G11C 16/00
(52) U.S. Cl. ............................ 365/185.21; 365/189.07; 365/203
(58) Field of Search ............................ 365/185.21, 207, 365/203, 189.07; 327/53, 66

(56) References Cited

U.S. PATENT DOCUMENTS 5,386,158 A * 1/1995 Wang .................... 365/189.07
6,157,571 A * 12/2000 Suzuki .................. 365/185.21
6,292,395 B1 * 9/2001 Lin ........................ 365/185.21

FOREIGN PATENT DOCUMENTS

JP 2000-90685 3/2000

* cited by examiner

Primary Examiner—Tan T. Nguyen
(74) Attorney, Agent, or Firm—McDermott, Will & Emery

(57) ABSTRACT

In the non-volatile semiconductor memory device, for a current mirror for reading out data of a memory cell, a diode-connected transistor and a cut transistor are provided. The diode-connected transistor makes a precharged voltage level lower than a power supply voltage level. The cut transistor reduces current consumption.

14 Claims, 13 Drawing Sheets

NON-VOLATILE SEMICONDUCTOR MEMORY DEVICE IMPROVED SENSE AMPLIFICATION CONFIGURATION

BACKGROUND OF THE INVENTION

1. Field of the Invention

The present invention relates to non-volatile semiconductor memory devices, and more particularly, to a configuration for reading data of a non-volatile memory cell.

2. Description of the Background Art

A sense amplification configuration in a conventional non-volatile semiconductor memory device will be described. Referring to FIG. 14, a non-volatile memory cell MC is connected to a detecting unit 50 via a Y gate M5 (NMOS transistor).

Detecting unit 50 includes an NMOS transistor M2, an inverter I1, PMOS transistors M1 and M3, and an NMOS diode M4.

Inverter I1 inverts a signal on a bit line BL. Transistor M2 is connected between a node N1 and bit line BL, and has its gate receiving an output of inverter I1.

Transistor M1 is connected between a power supply node Vcc and node N1, and has its gate connected to node N1. Transistor M3 is connected between power supply node Vcc and an output node N2, and has its gate connected to node N1. Transistors M1 and M3 constitute a current mirror.

NMOS diode M4 is connected between node N2 and a ground node GND that receives a ground voltage. A detected current flowing through transistor M3 is converted to a voltage by NMOS diode M4.

When a word line WL is selected and Y gate M5 is closed according to a gate signal YG, detecting unit 50 detects a current of memory cell MC, and the detected current is converted to a voltage. The detected data (voltage) is output from node N2. Thus, the data value of the memory cell is determined.

With the sense amplification configuration described above, however, transistor M3 is turned on during a precharging (charging) period of the bit line, as node N1 attains an intermediate voltage between 0 V and power supply voltage Vcc. This allows a current flow from power supply node Vcc through transistors M3 and M4 to ground node GND, thereby increasing current consumption.

One way to improve such a sense amplification configuration is shown in FIG. 15. In the configuration shown in FIG. 15, a cut transistor (PMOS transistor) M6' is connected between node N1 and power supply node Vcc. Transistor M6' is turned on/off according to a control signal PC. During the precharging period of the bit line, control signal PC is set to "L", so that transistor M6' is turned on, and node N1 attains a power supply voltage level Vcc. When transistor M6' turns on, transistor M3 turns off. Accordingly, a current is prevented from flowing through transistors M3 and M4, which reduces current consumption during the precharging period.

Assume, however, the case where control signal PC is set to power supply voltage level Vcc after completion of the precharging to turn off transistor M6', and then data of memory cell MC is read out while memory cell MC is in a state allowing a current flow therethrough (i.e., a stored state). In such a case, it would take a long time before the voltage of node N1 changes from power supply voltage level Vcc to a voltage level Vsense at which the read data can be determined.

Thus, data cannot be read out at high speed with just the sense amplification configuration as described above. Further, a high-precision data reading operation cannot be assured with such a sense amplification configuration.

SUMMARY OF THE INVENTION

An object of the present invention is to provide a non-volatile semiconductor memory device that permits reduction of current consumption, high-speed operation and high-precision reading.

The non-volatile semiconductor memory device according to an aspect of the present invention includes: a non-volatile memory cell; a word line corresponding to the memory cell; a bit line corresponding to the memory cell; and a detecting unit connected to the bit line and detecting stored data in the memory cell. The detecting unit includes: a current mirror formed of first and second transistors each connected to a power supply voltage node, detecting a current of the memory cell; a transistor diode-connected between the power supply voltage node and gates of the first and second transistors; and a current-voltage converting element converting the current detected by the current mirror to a voltage.

Preferably, the diode-connected transistor precharges the gates of the first and second transistors to a voltage level that is lower than the power supply voltage level.

In particular, the detecting unit further includes a cut transistor connected between the diode-connected transistor and the power supply voltage node.

In particular, the detecting unit further includes a bypass transistor connected between the gates of the first and second transistors and the power supply voltage node.

Preferably, the detecting unit further includes a cut transistor connected between the diode-connected transistor and the power supply voltage node, and a bypass transistor connected between the gates of the first and second transistors and the power supply voltage node. The cut transistor and the bypass transistor are turned on/off so as to reduce a precharging time of the bit line.

In particular, at the time of precharging the bit line, after the cut transistor and the bypass transistor are both turned on, the cut transistor is turned off earlier than the bypass transistor.

Preferably, the current-voltage converting element is connected to the second transistor at an output node outputting the stored data. The detecting unit further includes a cut transistor connected between the power supply voltage node and the second transistor. Alternatively, the detecting unit may further include a cut transistor connected between the current-voltage converting element and a ground node.

The non-volatile semiconductor memory device according to another aspect of the present invention includes: a non-volatile memory cell; a first bit line corresponding to the memory cell; a non-volatile reference cell; a second bit line corresponding to the reference cell; a first detecting unit, having a first current mirror therein, detecting stored data of the memory cell through the first bit line; a second detecting unit, having a second current mirror therein, detecting stored data of the reference cell through the second bit line; and a differential amplification unit that detects a difference between an output of the first detecting unit and an output of the second detecting unit to determine the stored data of the memory cell. The first and second detecting units are made to operate at different timings such that the precharging periods for the first and second bit lines become different from each other.

Preferably, the operating period of the second current mirror is shorter than the operating period of the first current mirror.

In particular, the first current mirror includes first and second transistors, and the second current mirror includes third and fourth transistors. The first detecting unit further includes a fifth transistor that is connected between the gates of the first and second transistors and a first power supply voltage node. The second detecting unit further includes a Id sixth transistor that is connected between the gates of the third and fourth transistors and a second power supply voltage node.

Preferably, the differential amplification unit starts an operation between the timing at which the first current mirror starts to operate and the timing at which the second current mirror starts to operate.

In particular, the differential amplification unit includes a differential amplification circuit that outputs a difference between the outputs of the first and second detecting units, an output node connected to the output node of the differential amplification circuit and outputting data of the memory cell, and a setting circuit connected to the output node and setting an initial state of the output node to a prescribed potential. The initial state is a state of the output node that would be obtained when a prescribed second current mirror is made to operate ahead of the first current mirror.

According to the non-volatile semiconductor memory device of the present invention, the bit line is precharged by the diode-connected transistor, which can shorten the data reading time. Further, the cut transistor is provided, which can reduce the current consumption.

In addition, according to the non-volatile semiconductor memory device of the present invention, when the data difference between the data cell and the reference cell is being detected by the differential amplifier, the precharging periods of the respective bit lines are differentiated from each other so that the data on the reference side is determined earlier. Accordingly, an increase of the current consumption due to switching is prevented, and high-speed and accurate data reading is enabled.

Further, the differential amplifier is made to operate between the timing at which the current mirror on the data cell side starts the operation and the timing at which the current mirror on the reference cell side starts the operation. Accordingly, an increase of the current consumption due to switching can be prevented.

Still further, according to the non-volatile semiconductor memory device of the present invention, the initial state of the output node of the differential amplifier is controlled to suppress an unnecessary voltage change of the output node. Accordingly, current consumption is reduced and a high-speed operation is enabled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
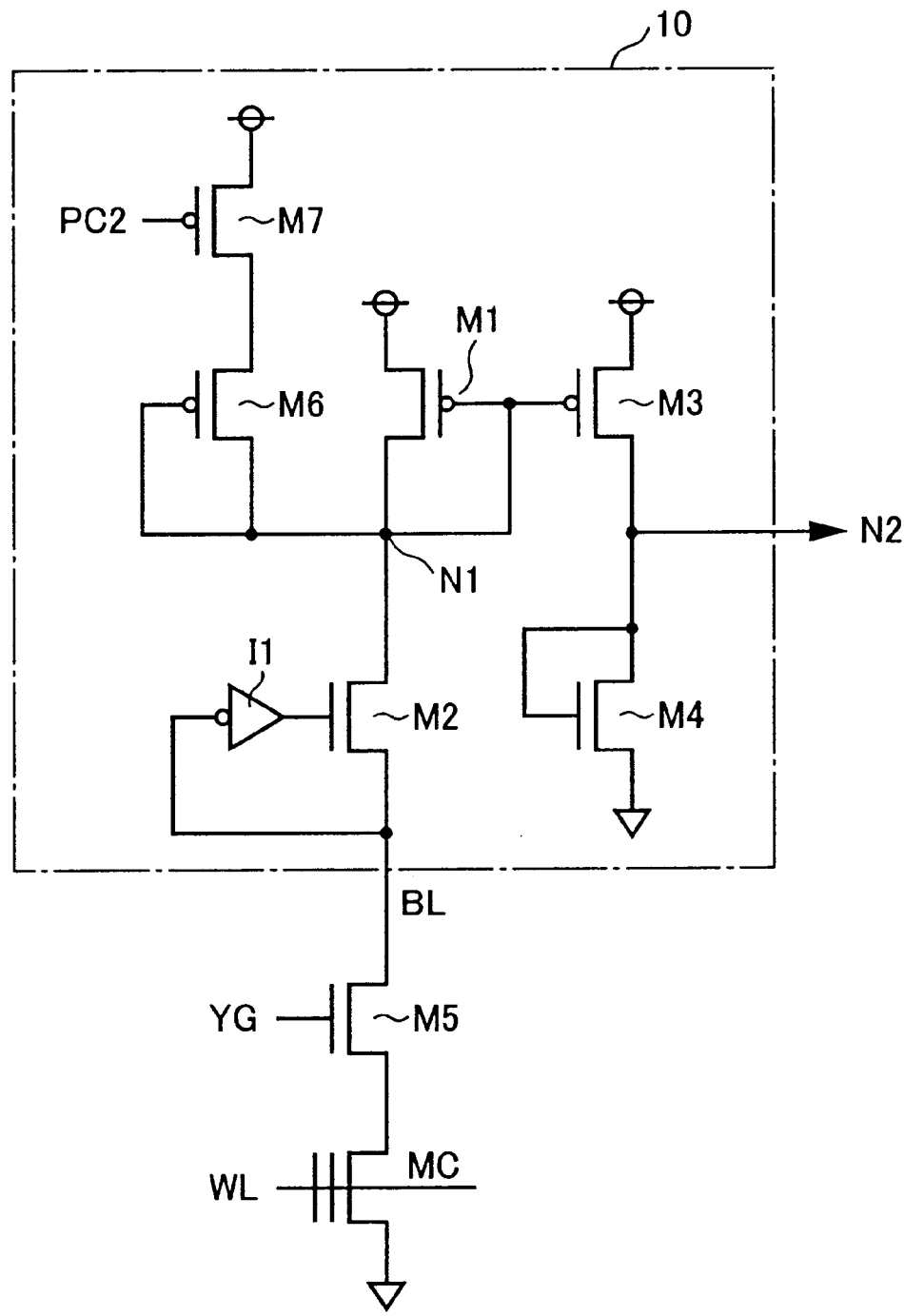
FIG. 1 shows a sense amplification configuration of the non-volatile semiconductor memory device according to a first embodiment of the present invention.

Hereinafter, non-volatile semiconductor memory devices as embodiments of the present invention will be descried with reference to the drawings, through which the same or corresponding portions are denoted by the same reference characters, and description thereof will not be repeated where appropriate.

First Embodiment

The sense amplification configuration of the non-volatile semiconductor memory device according to the first embodiment will be described with reference to FIG. 1.

Referring to FIG. 1, a memory cell MC is connected to a detecting unit 10 via a Y gate (NMOS transistor) M5. Detecting unit 10 includes an NMOS transistor M2, an inverter I1 and PMOS transistors M1 and M3.

Inverter I1 inverts a signal of a bit line BL. Transistor M2 is connected between a node N1 and bit line BL, and has its gate receiving an output of inverter I1.

Transistor M1 is connected between a power supply node Vcc and node N1, and has its gate connected to node N1. Transistor M3 is connected between power supply node Vcc and an output node N2, and has its gate connected to node N1.

Detecting unit 10 further includes a PMOS transistor M6, a PMOS transistor (cut transistor) M7, and an NMOS diode M4.

Transistor M6 is diode-connected to node N1. Transistor M7 is connected between power supply node Vcc and transistor M6, and serves to cut the current path between power supply node Vcc and transistor M6 according to a control signal PC2.

NMOS diode M4 is connected between node N2 and a node GND that receives a ground voltage. A detected current flowing through transistor M3 is converted to a voltage by NMOS diode M4.

When a word line WL is selected and Y gate M5 is opened according to a gate signal YG, detecting unit 10 detects a current of memory cell MC, and the detected current is converted to a voltage. The detected data (voltage) is output from node N2. Thus, the data value of the memory cell is determined.

Control signal PC2 is set to "L" when precharging the bit line before a sense operation. Transistor M7 is turned on, and thus, node N1 is charged (precharged) through transistor M6.

If the threshold value of transistor M6 is expressed as Vth, node N1 will reach a voltage level of approximately (Vcc−Vth) at the time of precharging.

Control signal PC2 is then set to "H" to complete the precharging, and reading is started (at time t1). At this time, when memory cell MC turns "ON", the potentials of bit line BL and node N1 start to fall.

It is considered that the read data is determined when the potential of node N1 drops below a prescribed potential level Vsense.

Figure 2:
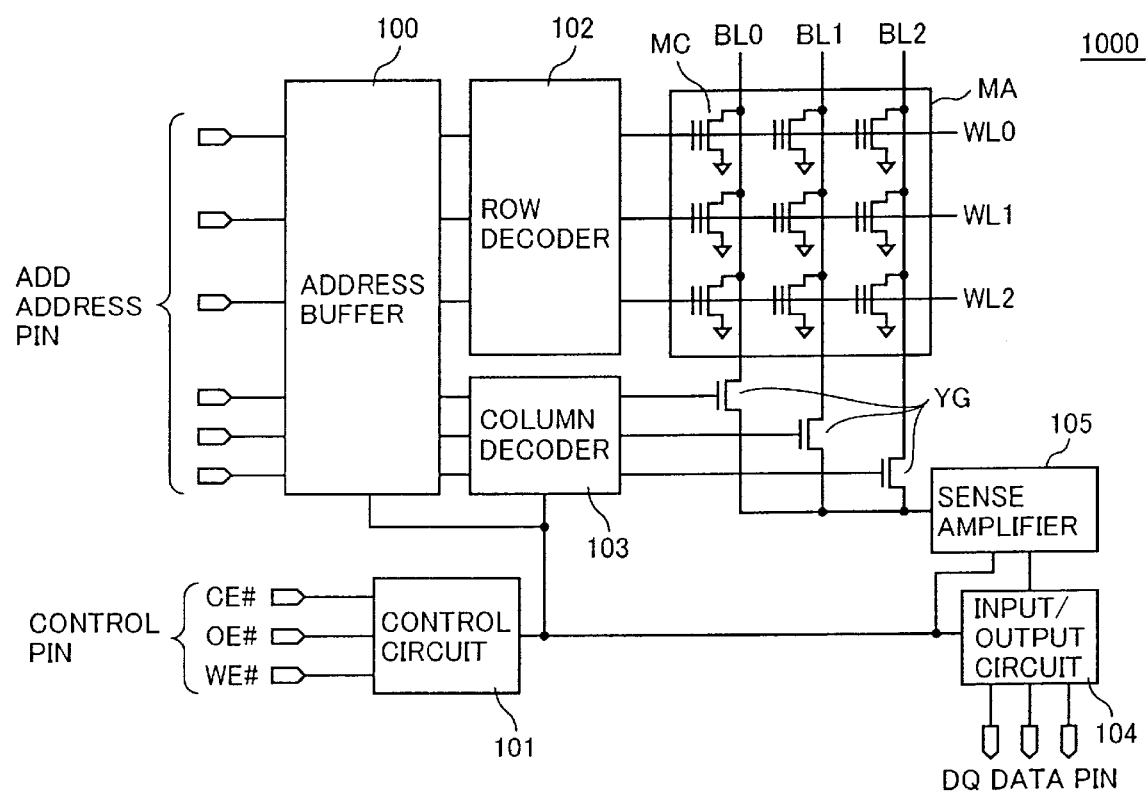
FIG. 2 shows an exemplary entire configuration of the non-volatile semiconductor memory device 1000 of the first embodiment.

An example of the entire configuration of the non-volatile semiconductor memory device 1000 of the first embodiment is shown in FIG. 2. Referring to FIG. 2, non-volatile semiconductor memory device 1000 includes: a memory cell array MA having a plurality of memory cells MC arranged in rows and columns, word lines WL0, WL1, WL2, . . . arranged in the row direction and bit lines BL0, BL1, BL2, . . . arranged in the column direction; an address buffer 100 receiving an external address signal from address pins ADD; a control circuit 101 receiving external control signals (chip enable signal CE#, output enable signal OE#, write enable signal WE# and others) from control pins and outputting internal control signals for control of operations of the internal circuits; a row decoder 102 decoding an internal row address output from address buffer 100 to select a row of memory cell array MA; a column decoder 103 decoding an internal column address output from address buffer 100 to select a column of memory cell array MA; and Y gates YG provided for the respective bit lines and turned on according to the outputs of column decoder 103.

Non-volatile semiconductor memory device 1000 further includes: an input/output circuit 104 receiving data from data input/output pins DQ or outputting data read out from memory cell array MA to data input/output pins DQ; and a sense amplifier 105 detecting a read current from the memory cell to determine the read data. Detecting unit 10 and NMOS diode M4 described above are included in sense amplifier 105.

Figure 3:
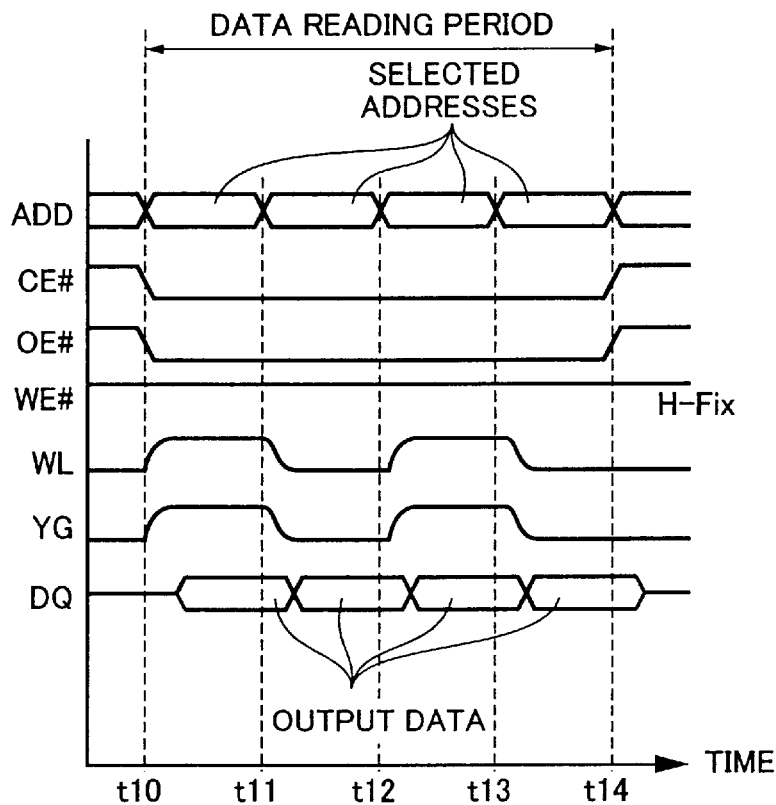
FIG. 3 is a timing chart schematically illustrating the operation of the non-volatile semiconductor memory device 1000 of the first embodiment.

The operation of non-volatile semiconductor memory device 1000 will be described with reference to FIG. 3. Data is read out during a time period between time t10 and time t14. At time t10, control signals CE# and OE# each attain an L level. At times t10, t11, t12 and t13, selected addresses are input from address pins ADD. Data of the memory cell is externally output according to the selection of word line WL and Y gate YG.

Figure 4:
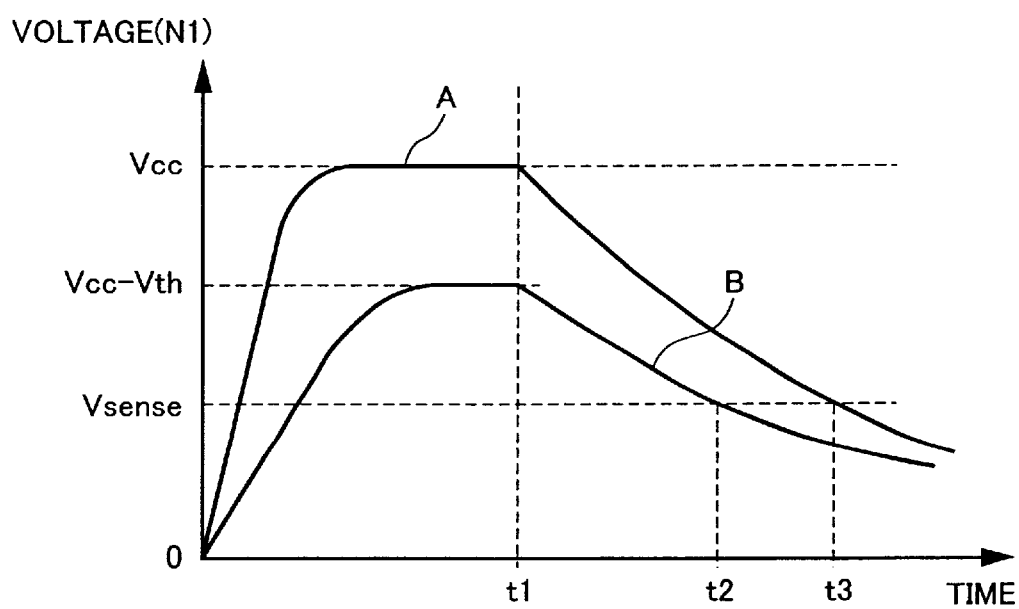
FIG. 4 illustrates the reading speed of the non-volatile semiconductor memory device of the first embodiment.
Figure 15:
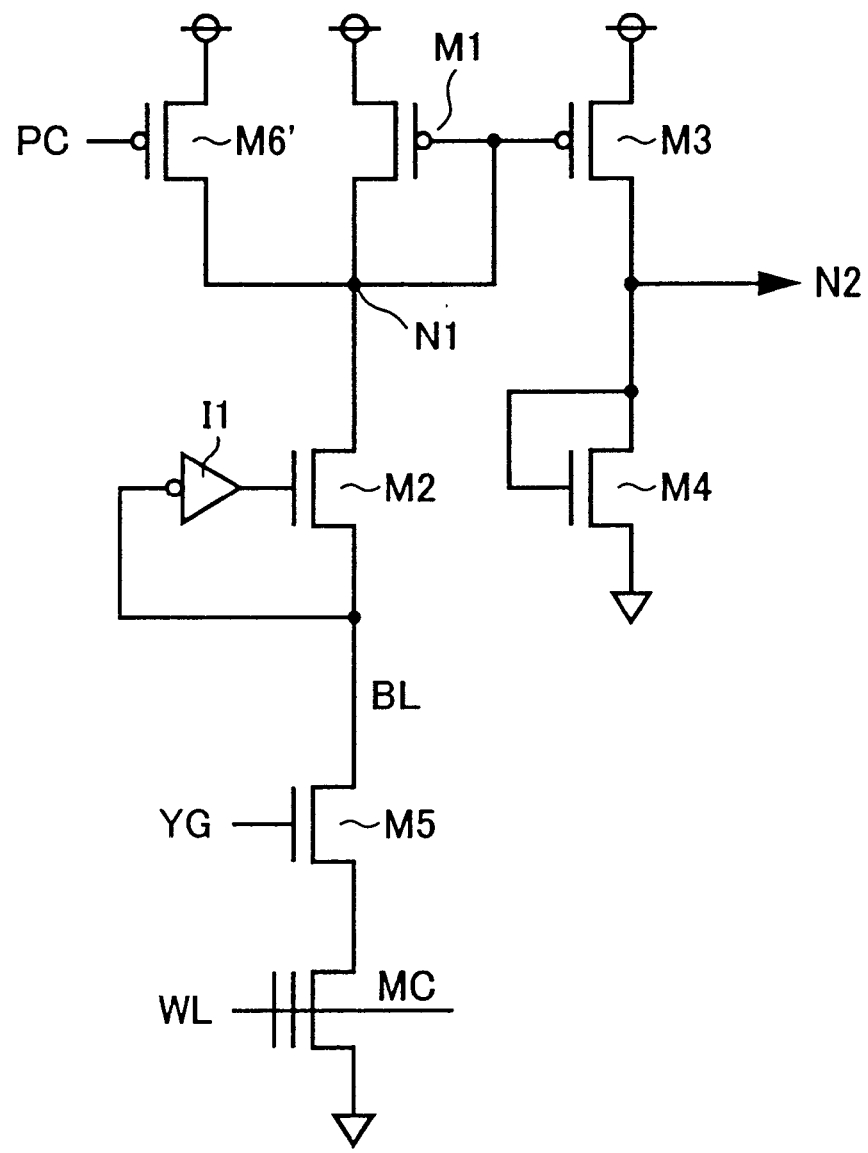
FIG. 15 illustrates another example of the sense amplification configuration of a conventional non-volatile semiconductor memory device.

Here, the difference in read time between the conventional configuration shown in FIG. 15 and the first embodiment will be described with reference to FIG. 4. Referring to FIG. 4, "A" shows a voltage change of node N1 at the time of reading, in the case where node N1 is precharged to the power supply voltage level Vcc (corresponding to FIG. 15). "B" shows a voltage change of node N1 at the time of reading, in the case where node N1 is precharged to the voltage level of (Vcc−Vth) according to the first embodiment.

With the conventional configuration (A), node N1 attains the power supply voltage level Vcc before the sense operation starts, and the voltage of node N1 starts to fall with the start of the reading (at time t1). By comparison, with the configuration of the first embodiment (B), node N1 attains the (Vcc−Vth) level before the start of the sense operation. It means that the voltage level reached by precharging in the case of B is closer to the voltage level Vsense than that in the case of A.

Thus, the voltage of node N1 drops across the Vsense level for determination of the read data, earlier in B than in A. Accordingly, using the configuration of the first embodiment, data can be read out rapidly.

Second Embodiment

The sense amplification configuration of the non-volatile semiconductor memory device according to the second embodiment will be described with reference to FIG. 5.

Figure 5:
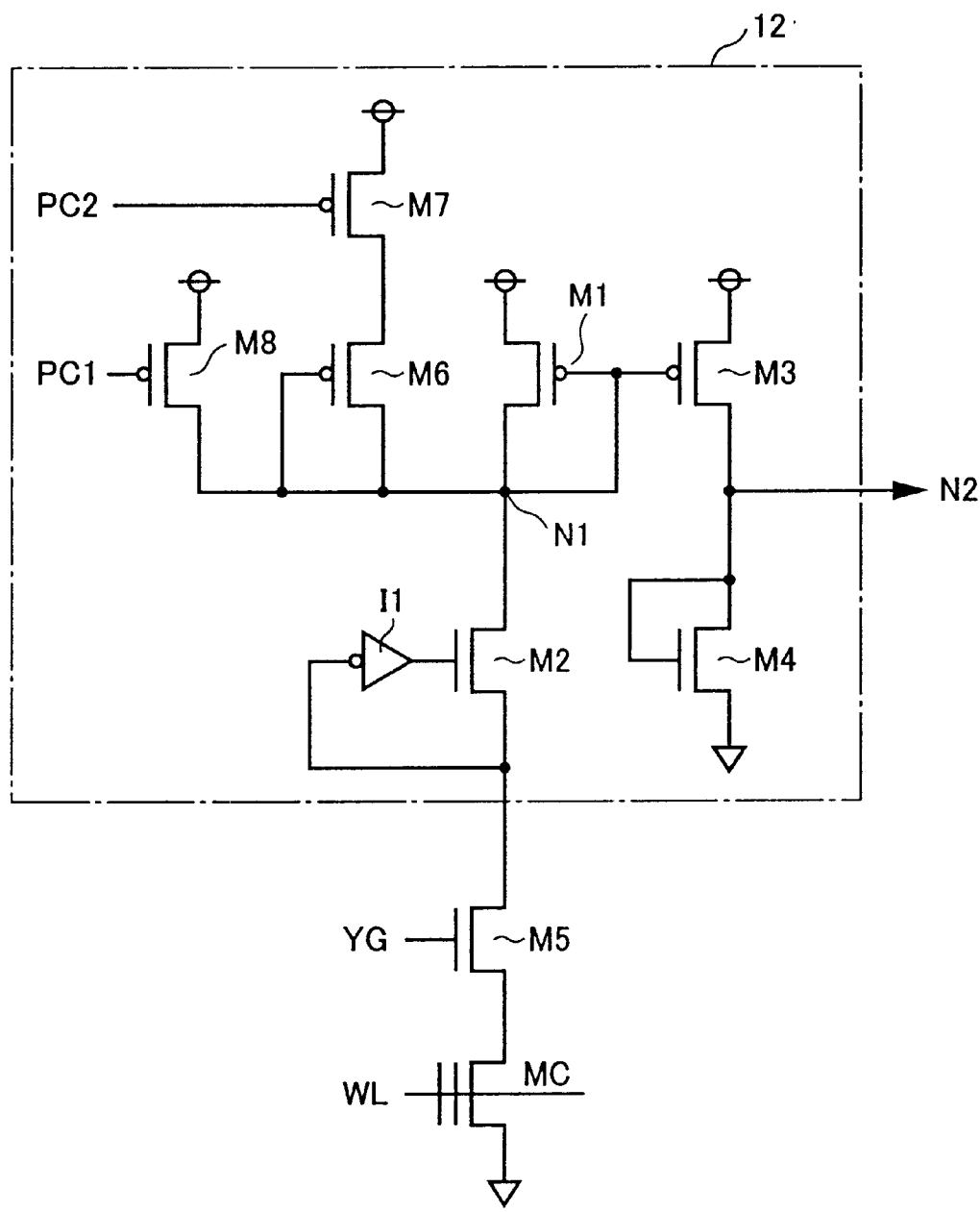
FIG. 5 shows a sense amplification configuration of the non-volatile semiconductor memory device according to a second embodiment of the present invention.

Referring to FIG. 5, memory cell MC is connected to a detecting unit 12 via Y gate M5. Detecting unit 12 includes NMOS transistor M2, inverter I1, transistors M1 and M3, and NMOS diode M4.

Detecting unit 12 further includes PMOS transistor M6, PMOS transistor (cut transistor) M7, and a PMOS transistor (bypass transistor) M8.

Transistor M6 is diode-connected to node N1. Transistor M7 is connected between power supply node Vcc and transistor M6, and serves to cut the path between power supply node Vcc and transistor M6 according to control signal PC2.

Transistor M8 is connected between power supply node Vcc and node N1, and is turned on/off according to a control signal PC1 supplied to its gate.

A detected current flowing through transistor M3 is converted to a voltage by NMOS diode M4. The detected data (voltage) is output from node N2.

Control signal PC2 is set to "L" when precharging the bit line before the sense operation. Transistor M7 is turned on, and node N1 is precharged via transistor M6. Thus, high-speed data reading as in the first embodiment is enabled.

Similarly, control signal PC1 is set to "L" when precharging the bit line before the sense operation. Transistor M8 is then turned on, and node N1 is precharged to the Vcc level via transistor M8. When node N1 attains the Vcc level, transistor M3 is turned off, so that a current is prevented from flowing through transistors M3 and M4. Accordingly, the current consumed during the precharging period of the bit line can be reduced.

Third Embodiment

Figure 6:
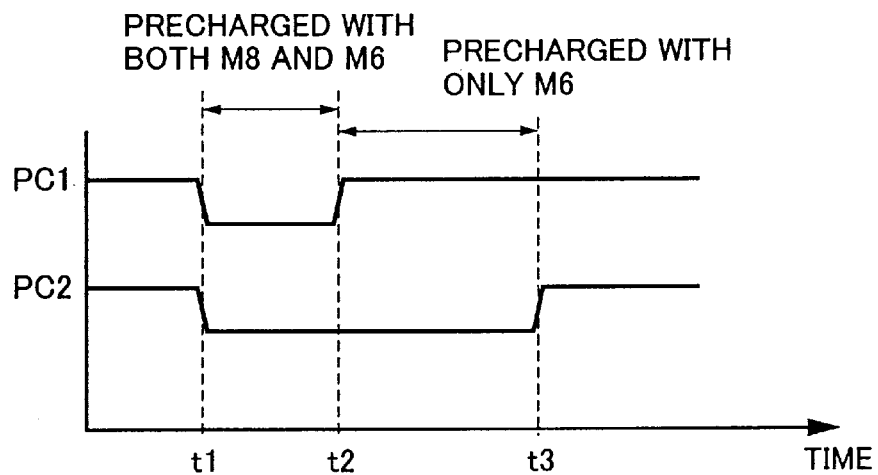
FIG. 6 is a timing chart illustrating the control of the non-volatile semiconductor memory device according to a third embodiment of the present invention.
Figure 7:
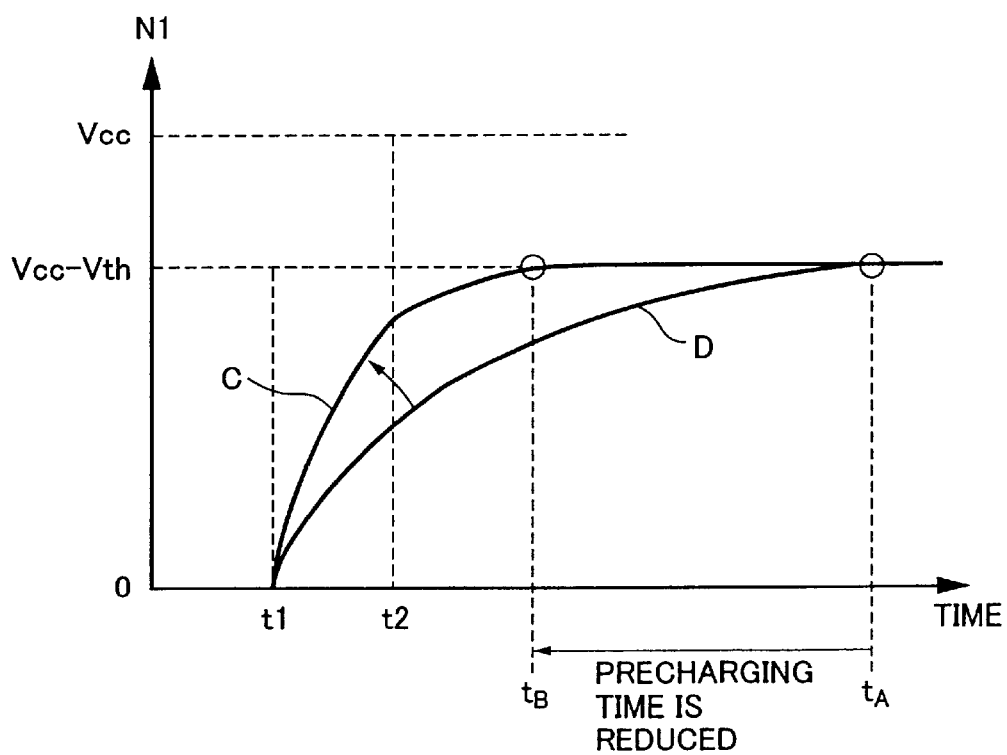
FIG. 7 illustrates the reading speed of the non-volatile semiconductor memory device of the third embodiment.

In the third embodiment, a way of controlling the non-volatile semiconductor memory device of the second embodiment will be described. FIG. 6 illustrates timings of control signals PC1 and PC2, and FIG. 7 illustrates potential changes in node N1.

Referring to FIG. 6, control signals PC1 and PC2 are set to "L" during a time period between t1 and t2, to precharge node N1 using both transistors M6 and M8. The period (t2−t1) is restricted to the extent that node N1 does not exceed (Vcc−Vth).

During a time period from t2 to t3, only the control signal PC1 is set to "H", so that node N1 is precharged just with transistor M6. At time t3, control signal PC2 is set to "H", and the precharging is completed.

The potential changes in node N1 during the precharging will be described with reference to FIG. 7. In FIG. 7, "C" shows the potential changes in node N1 according to the third embodiment, while "D" shows the same in the case of the first embodiment.

In the third embodiment, the precharging of node N1 is accelerated using transistors M8 and M6 during the tine period between t1 and t2. Thus, the time required for node N1 to reach the desired voltage level (Vcc−Vth) is considerably reduced. As a result, a more rapid data reading can be realized.

Fourth Embodiment

The sense amplification configuration of the non-volatile semiconductor memory device according to the fourth embodiment will be described with reference to FIG. 8.

Figure 8:
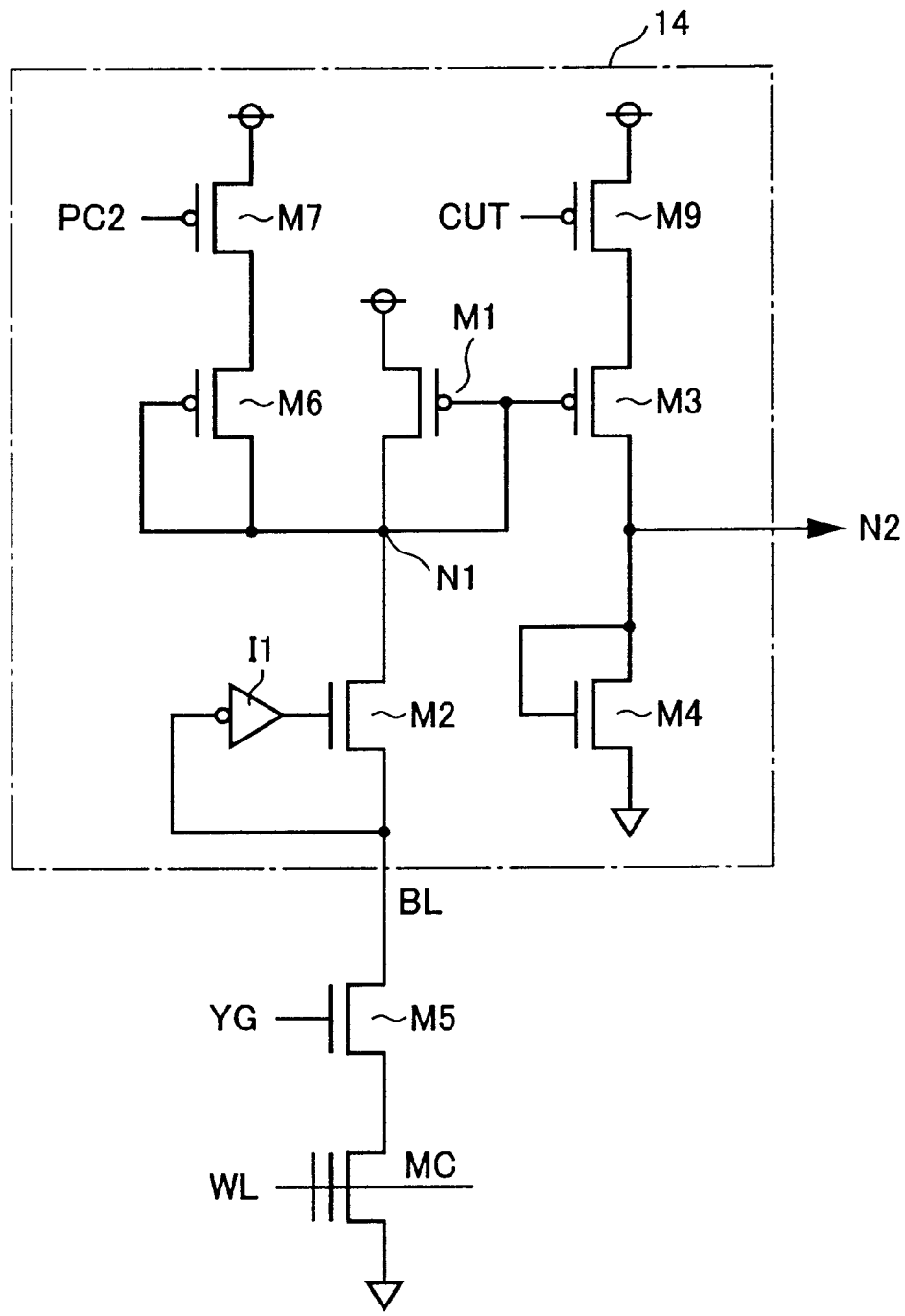
FIG. 8 shows a sense amplification configuration of the non-volatile semiconductor memory device according to a fourth embodiment of the present invention.

Referring to FIG. 8, memory cell MC is connected to a detecting unit 14 via Y gate M5. Detecting unit 14 includes NMOS transistor M2, inverter I1, PMOS transistors M1, M3, M6, M7 and M9, and NMOS diode M4.

Transistor M1 is connected between power supply node Vcc and node N1. Transistor M3 is connected between transistor M9 and output node N2.

Transistor (cut transistor) M9 serves to cut the current path from power supply node Vcc to transistor M3 according to a control signal CUT.

Transistor M6 is diode-connected to node N1. Transistor (cut transistor) M7 is connected between power supply node Vcc and transistor M6, and serves to cut the current path between power supply node Vcc and transistor M6 according to control signal PC2.

A detected current flowing through transistor M3 is converted to a voltage by NMOS diode M4. The detected data (voltage) is output from node N2.

Control signal PC2 is set to "L" when precharging the bit line before the sense operation. Transistor M7 is turned on, and node N1 is precharged via transistor M6. Accordingly, high-speed data reading as in the first embodiment is enabled.

In addition, control signal CUT is set to "H" when precharging the bit line before the sense operation. Transistor M9 is turned off, resulting in no current flowing through transistors M3 and M4. As a result, the current consumption during the precharging period can be reduced.

Fifth Embodiment

The sense amplification configuration of the non-volatile semiconductor memory device according to the fifth embodiment will be described with reference to FIG. 9.

Figure 9:
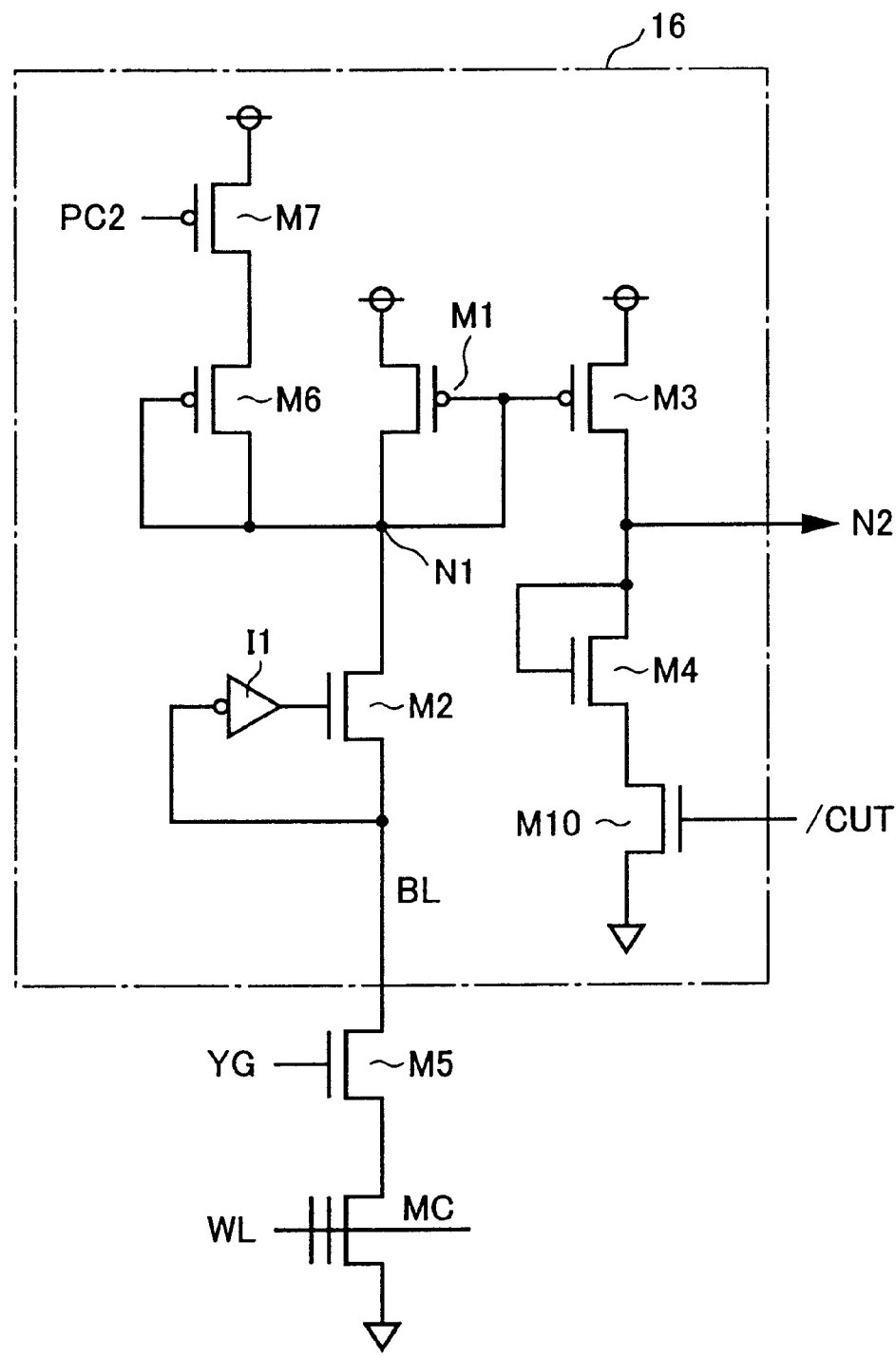
FIG. 9 shows a sense amplification configuration of the non-volatile semiconductor memory device according to a fifth embodiment of the present invention.

Referring to FIG. 9, memory cell MC is connected to a detecting unit 16 via Y gate M5. Detecting unit 16 includes NMOS transistor M2, inverter I1, transistors M1 and M3, PMOS transistors M6 and M7, an NMOS transistors M10, and NMOS diode M4.

Transistor M7 controls the flow of the current between transistor M6, which is diode-connected to node N1, and power supply node Vcc according to control signal PC2.

Between node N2 and node GND receiving a ground voltage, NMOS diode M4, which converts the detected current to a voltage, and NMOS transistor (cut transistor) M1 are connected. Transistor M10 serves to cut the current path according to a control signal/CUT that is an inverted version of control signal CUT.

Control signal/CUT is set to "L" when precharging the bit line before the sense operation. Transistor M10 is turned off, and thus, there is no current flowing through transistors M3 and M4. As a result, the current consumption during the precharging period is reduced.

Sixth Embodiment

The sense amplification configuration of the non-volatile semiconductor memory device according to the sixth embodiment will be described with reference to FIG. 10.

Figure 10:
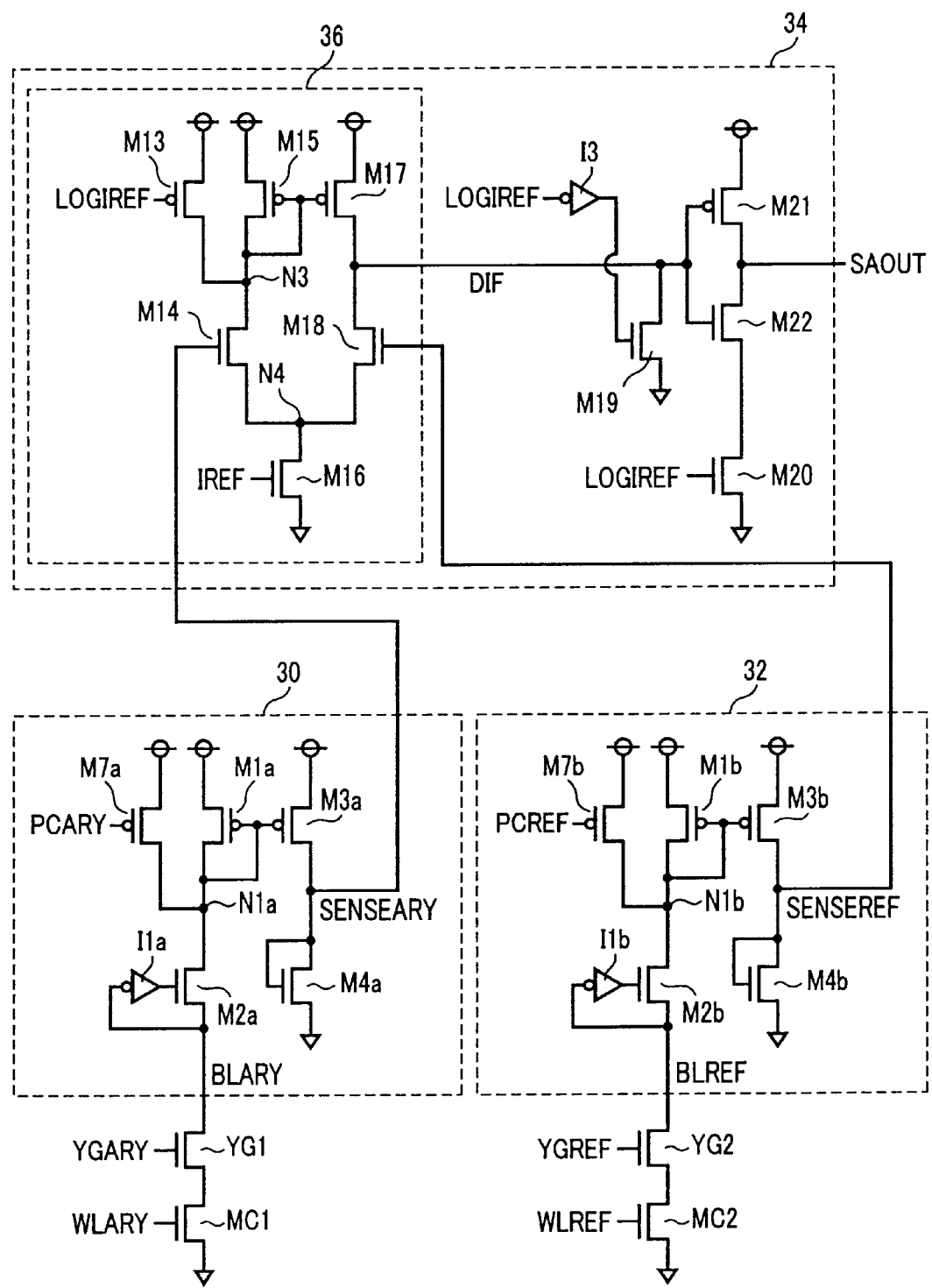
FIG. 10 shows a sense amplification configuration of the non-volatile semiconductor memory device according to a sixth embodiment of the present invention.

Referring to FIG. 10, the non-volatile semiconductor memory device of the sixth embodiment includes a detecting unit 30 arranged on the memory cell (data cell) side, a detecting unit 32 arranged on the reference cell side, and a differential amplification unit 34.

A memory cell MC1 is connected to detecting unit 30 via a Y gate (NMOS transistor) YG1.

Detecting unit 30 includes an NMOS transistor M2a, an inverter I1a, PMOS transistors M1a and M3a, and an NMOS diode M4a.

The input node of inverter I1a is connected to a bit line BLARY of memory cell MC1. Transistor M2a is connected between a node N1a and bit line BLARY and has its gate receiving an output of inverter I1a. Transistor M1a is connected between power supply node Vcc and node N1a and has its gate connected to node N1a. Transistor M3a is connected between power supply node Vcc and an output node SENSEARY, and has its gate connected to node N1a. Transistors M1a and M3a constitute a current mirror.

NMOS diode M4a is connected between a ground node GND and output node SENSEARY. NMOS diode M4a converts the detected current flowing through transistor M3a to a voltage.

Detecting unit 30 further includes a PMOS transistor (cut transistor) M7a. Transistor M7a is connected between power supply node Vcc and node N1a, and is turned on/off according to a control signal PCARY.

A reference cell MC2 is connected to detecting unit 32 via a Y gate (NMOS transistor) YG2.

Detecting unit 32 includes an NMOS transistor M2b, an inverter I1b, PMOS transistors M1b and M3b, and an NMOS diode M4b.

The input node of inverter I1b is connected to a bit line BLREF of reference cell MC2. Transistor M2b is connected between a node N1b and bit line BLREF, and has its gate receiving an output of inverter I1b. Transistor M1b is connected between power supply node Vcc and node N1b, and has its gate connected to node N1b. Transistor M3b is connected between power supply node Vcc and an output node SENSEREF, and has its gate connected to node N1b. Transistors M1b and M3b constitute a current mirror.

NMOS diode M4b is connected between ground node GND and output node SENSEREF. The detected current flowing through transistor M3b is converted to a voltage by NMOS diode M4b.

Detecting unit 32 further includes a PMOS transistor (cut transistor) M7b. Transistor M7b is connected between power supply node Vcc and node N1b, and is turned on/off according to a control signal PCREF.

When a word line WLARY is selected and Y gate YG1 is opened according to a gate signal YGARY, detecting unit 30 detects a current of memory cell MC1, and the detected current is converted to a voltage. The detected data (voltage) is output from node SENSEARY.

When a word line WLREF is selected and Y gate YG2 is opened according to a gate signal YGREF, detecting unit 32 detects a current of reference cell MC2, and the detected current is converted to a voltage. The detected data (voltage) is output from node SENSEREF.

Differential amplification unit 34 includes a differential amplification circuit 36, an inverter I3, NMOS transistors M19, M20 and M22, and a PMOS transistor M21.

Differential amplification circuit 36 includes PMOS transistors M13, M15 and M17 and NMOS transistors M14, M16 and M18. Transistor M14 is connected between nodes N3 and N4, and has its gate connected to node SENSEARY. Transistor M18 is connected between a node DIF and node N4, and has its gate connected to node SENSEREF. Transistor M16 is connected between node N4 and ground node GND, and has its gate receiving a control signal IREF.

Transistor M15 is connected between power supply node Vcc and node N3. Transistor M17 is connected between power supply node Vcc and node DIF. The gates of transistors M15 and M1 are connected to node N3.

Transistor M13 is connected between power supply node Vcc and node N3, and has its gate receiving a control signal LOGIREF. Transistor M13 turns on/off according to the control signal LOGIREF.

Inverter I3 inverts control signal LOGIREF. Transistor M19 is connected between node DIF and ground node GND, and has its gate receiving the output of inverter I3. Node DIF attains ground level GND according to control signal LOGIREF.

Transistor M21 is connected between power supply node Vcc and an output node SAOUT, and has its gate receiving a signal of node DIF. Transistor M22 is connected between output node SAOUT and transistor M20, and has its gate receiving the signal of node DIF. Transistor M20 is connected between transistor M22 and ground node GND, and has its gate receiving control signal LOGIREF.

Figure 11:
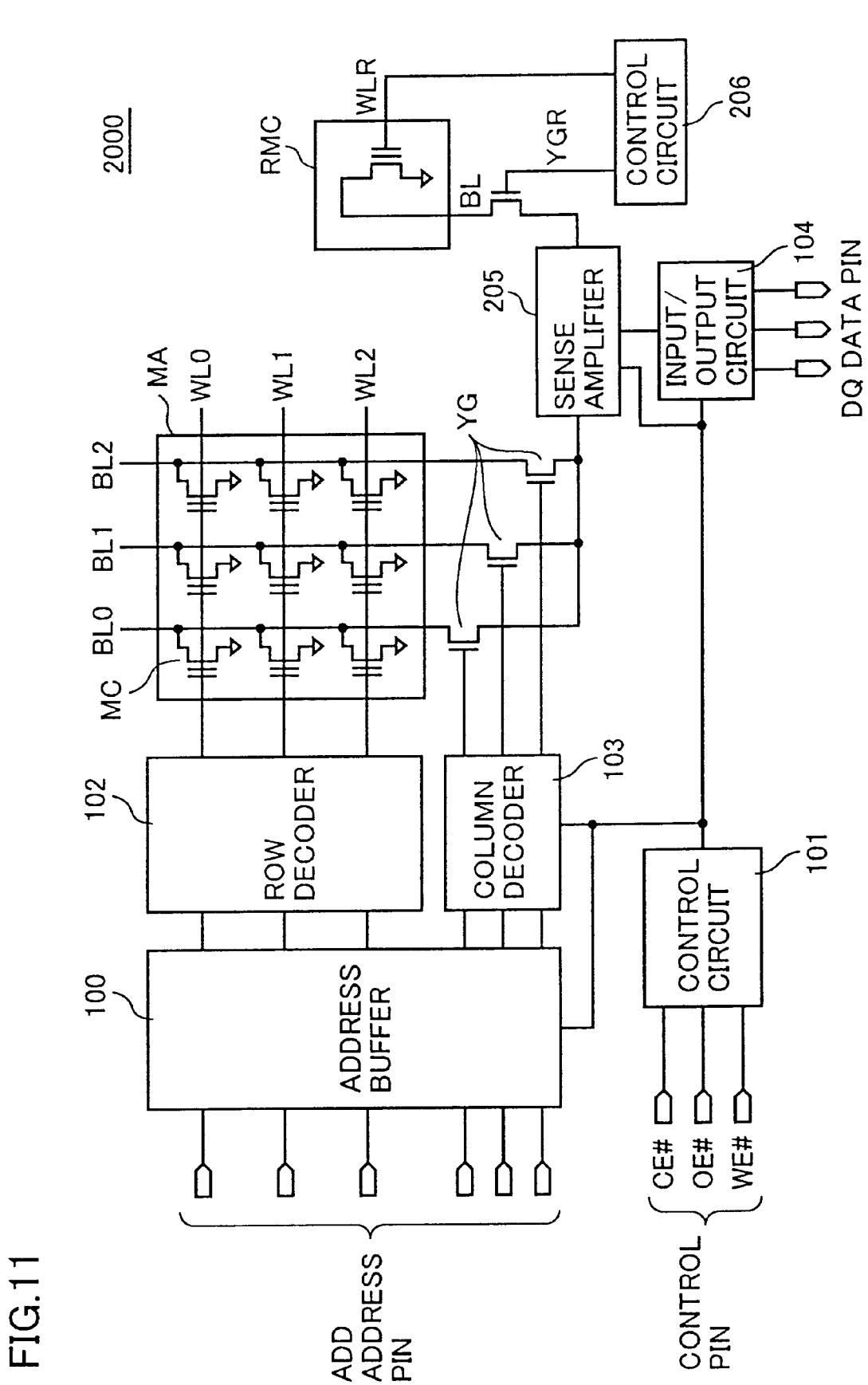
FIG. 11 shows an exemplary entire configuration of the non-volatile semiconductor memory device 2000 of the sixth embodiment.

The entire configuration of the non-volatile semiconductor memory device 2000 of the sixth embodiment will be described in brief with reference to FIG. 11. Referring to FIG. 11, non-volatile semiconductor memory device 2000 according to the sixth embodiment includes: a memory cell array MA having a plurality of memory cells MC arranged in rows and columns, word lines WL0, WL1, WL2, . . . arranged in the row direction and bit lines BL0, BL1, BL2 . . . arranged in the column direction; an address buffer 100 receiving an external address signal from address pins ADD; a control circuit 101 receiving external control signals (chip enable signal CE#, output enable signal OE#, write enable signal WE# and others) from control pins and outputting internal control signals for control of operations of the internal circuits; a row decoder 102 decoding an internal row address output from address buffer 100 to select a row of memory cell array MA; a column decoder 103 decoding an internal column address output from address buffer 100 to select a column of memory cell array MA; and Y gates YG provided for the respective bit lines and turned on according to the outputs of column decoder 103.

Non-volatile semiconductor memory device 2000 further includes: an input/output circuit 104 receiving data from data input/output pins DQ or outputting data read out from memory cell array MA to data input/output pins DQ; a sense amplifier 205 for determining the read data of the memory cell; a reference cell RMC; a word line WLR corresponding to reference cell RMC; a bit line BL corresponding to reference cell RMC; a Y gate YGR for connecting the bit line BL corresponding to the reference cell to sense amplifier 205; and a control circuit 206 controlling selection of Y gate YGR and word line WLR.

Figure 12:
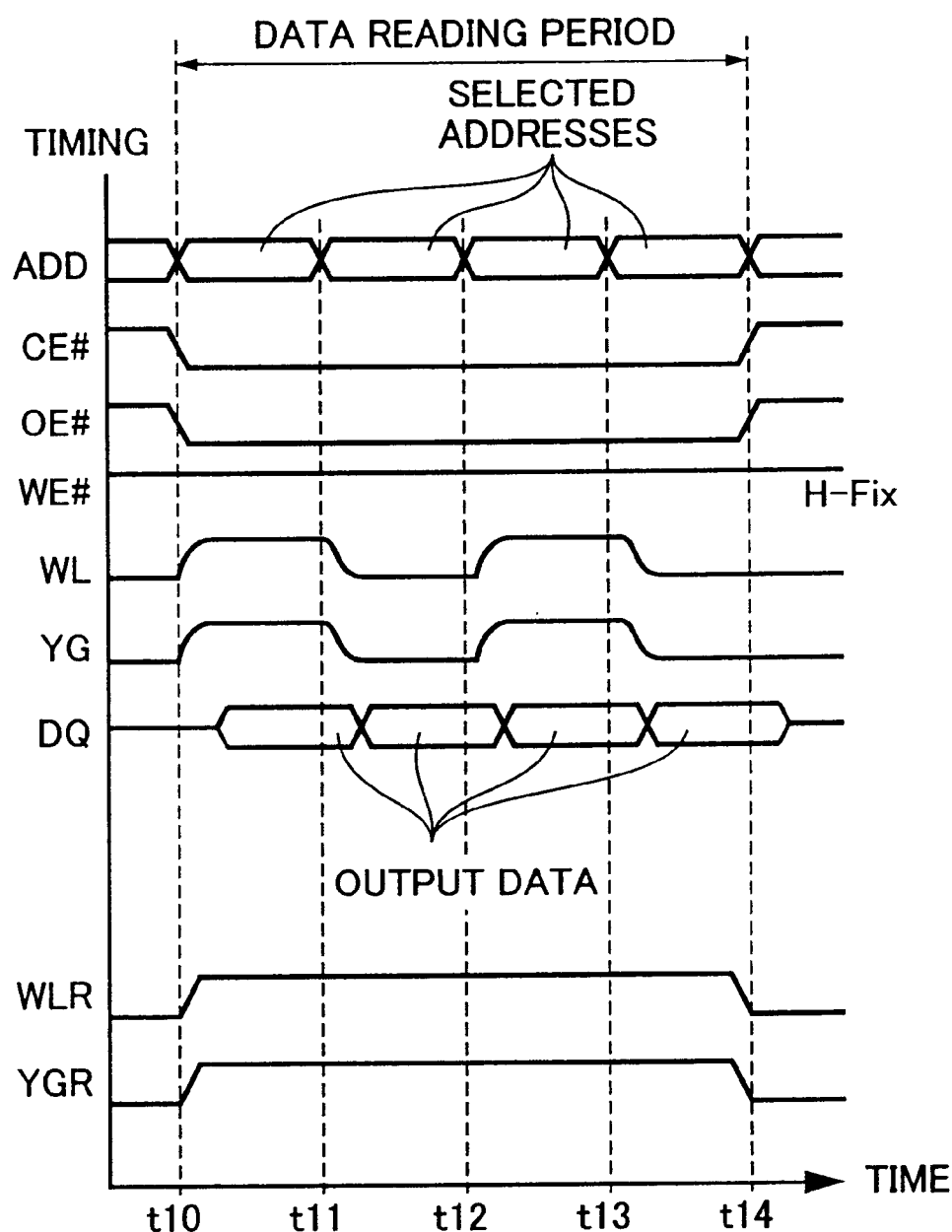
FIG. 12 is a timing chart schematically illustrating the operation of the non-volatile semiconductor memory device 2000 of the sixth embodiment.

The operation of non-volatile semiconductor memory device 2000 will be described in brief with reference to FIG. 12. Data is read out during a time period between t10 and t14. At time t10, control signals CE# and OE# each attain an L level. At times t10, t11, t12 and t13, selected addresses are input from address pins ADD. Data of the memory cell is externally output according to the selection of word line WL and Y gate YG on the data cell side and the selection of word line WLR and Y gate YGR on the reference cell side.

Now, a way of controlling the non-volatile semiconductor memory device according to the sixth embodiment will be described with reference to FIG. 13. At time tA, word lines WLREF and WLARY are raised to turn on Y gates YGREF and YGARY.

At time tA, control signals PCREF and PCARY are each set to an L level, so that precharging of bit line BLREF on the reference side and of bit line BLARY on the data cell side is started.

At time tB, control signal PCREF is turned to an H level to terminate the precharging of bit line BLREF, and detecting unit 32 on the reference cell side is made to operate. Control signal PCARY is maintained at the L level.

At time tC a prescribed time period after time tB, control signals IREF and LOGIREF are each turned to an H level to cause differential amplification unit 34 to operate.

At time tD, control signal PCARY is turned to an H level to terminate the precharging of bit line BLARY, and detecting unit 30 on the data cell side starts operating.

In general, the reference cell exists in an array not so large as the memory cell array in which the data cell exists. Thus, the load on the bit line corresponding to the reference cell is small compared to the load on the bit line corresponding to the data cell. It means that a shorter precharging period will suffice for the bit line corresponding to the reference cell than for the bit line corresponding to the data cell.

Thus, according to the sixth embodiment, the precharging period of the bit line on the reference side is set shorter. Accordingly, it becomes possible to determine the data on the reference cell side earlier, so that a change of read data due to switching can be prevented.

In addition, according to the sixth embodiment, the operating timing (tC) of differential amplification unit 34 is set between the timing (tB) at which the current mirror operation on the reference cell side starts and the timing (tD) at which the current mirror operation on the data cell side starts.

Node DIF is kept at the ground potential level GND during the time period between tB and tC by means of transistor M19. During the time period between tC and tD, transistors M16 and M18 keep node DIF at the ground potential level GND.

Thus, before and after time tC, node DIF is maintained at the ground potential level, so that an unnecessary voltage change due to switching can be prevented.

As explained above, according to the sixth embodiment, the operating timings are adjusted in the sense amplification configuration, which enables reduction of the current consumption.

Seventh Embodiment

The sense amplification configuration of the non-volatile semiconductor memory device according to the seventh embodiment will be described. The configuration of the non-volatile semiconductor memory device of the seventh embodiment is identical to that of the sixth embodiment.

In the seventh embodiment, in the sense operation of differential amplification unit 34, the initial state of the differential amplifier is made the same as the case where detecting unit 32 on the reference cell side operates ahead of detecting unit 30 on the data cell side.

Figure 13:
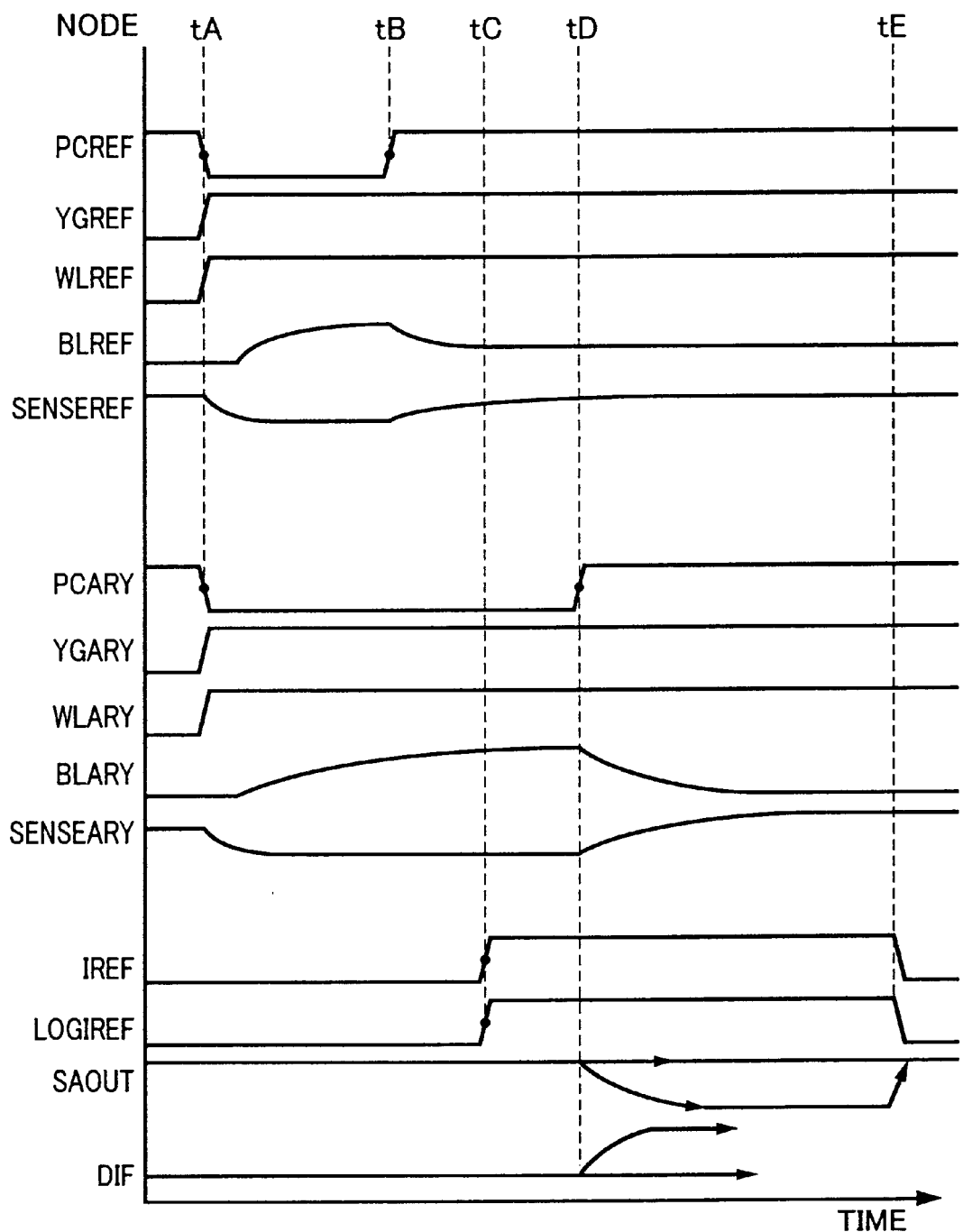
FIG. 13 is a timing chart illustrating the control of the non-volatile semiconductor memory device of the sixth embodiment.
Figure 14:
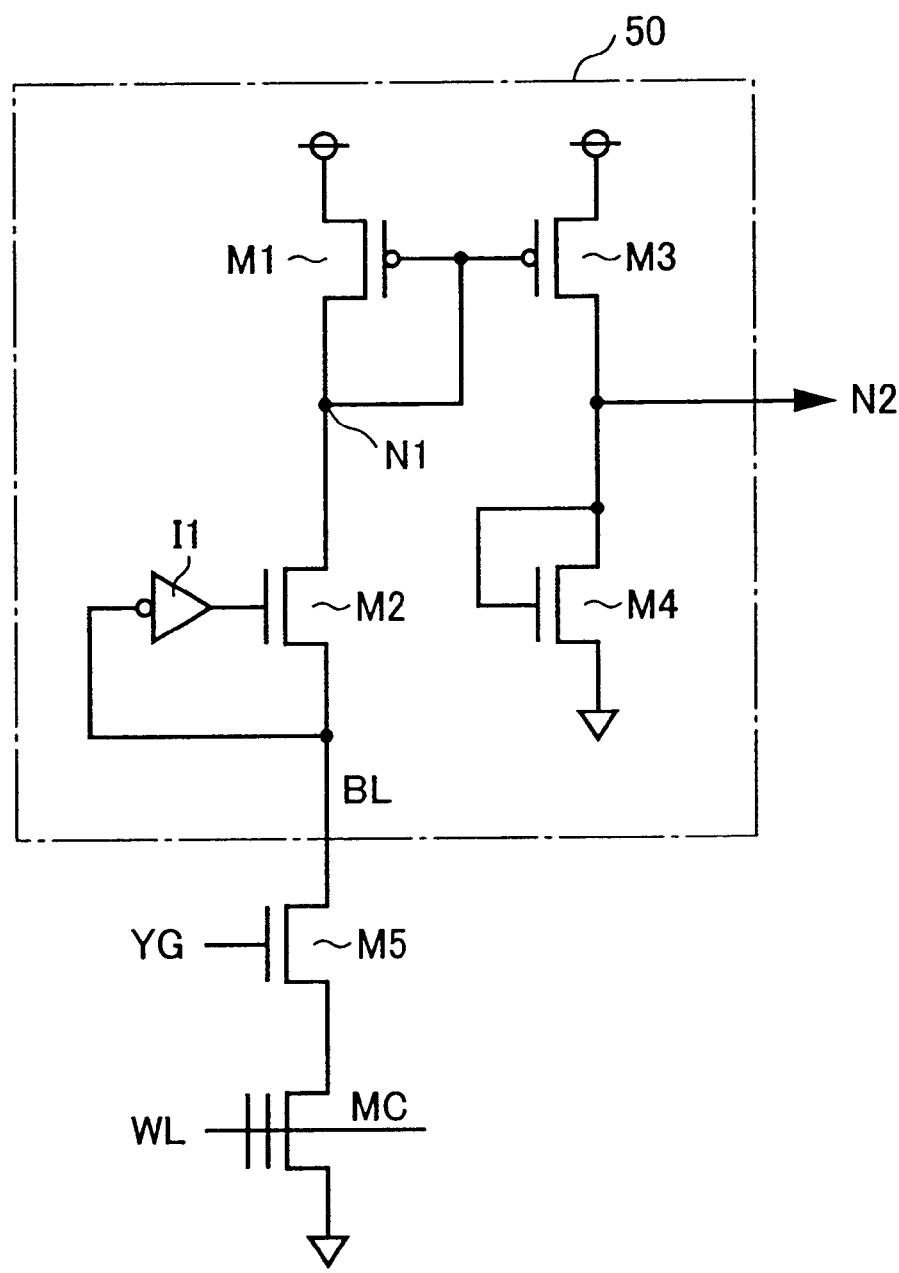
FIG. 14 illustrates an example of the sense amplification configuration of a conventional non-volatile semiconductor memory device.

More specifically, referring to FIGS. 10 and 13, when detecting unit 32 on the reference cell side operates ahead of detecting unit 30 on the data cell side, node DIF is kept at the ground potential level GND by means of transistors M16 and M18 (which is defined as a state X). In the seventh embodiment, the potential of node DIF is controlled such that it is maintained at the ground potential GND (state X) even before time tA and after time tE when neither detecting unit 32 on the reference cell side nor detecting unit 30 on the data cell side is operating. Specifically, transistor M19 is used for such control of the potential of node DIF.

Node DIF is thus maintained at the ground potential level GND, except at time tD when detecting unit 30 on the data cell side operates for differential sensing, and the output SAOUT is (constantly) kept at an H level. Accordingly, without an unnecessary voltage change due to switching, current consumption can be reduced. An excessive access time is also avoided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a non-volatile memory cell;
   a word line corresponding to said memory cell;
   a bit line corresponding to said memory cell; and
   a detecting unit connected to said bit line and detecting stored data of said memory cell,
   said detecting unit including
   a current mirror, having first and second transistors each connected to a power supply voltage node, detecting a current of said memory cell,
   a transistor diode-connected between said power supply voltage node and gates of said first and second transistors, and
   a current-voltage converting element converting the current detected by said current mirror to a voltage.

2. The non-volatile semiconductor memory device according to claim 1, wherein said diode-connected transistor precharges the gates of said first and second transistors to a voltage level that is lower than a power supply voltage level.

3. The non-volatile semiconductor memory device according to claim 2, wherein said detecting unit further includes a cut transistor connected between said diode-connected transistor and said power supply voltage node.

4. The non-volatile semiconductor memory device according to claim 3, wherein said detecting unit further includes a bypass transistor connected between the gates of said first and second transistors and said power supply voltage node.

5. The non-volatile semiconductor memory device according to claim 2, wherein said detecting unit further includes
   a cut transistor connected between said diode-connected transistor and said power supply voltage node, and
   a bypass transistor connected between the gates of said first and second transistors and said power supply voltage node,
   said cut transistor and said bypass transistor being turned on/off so as to reduce a precharging time of said bit line.

6. The non-volatile semiconductor memory device according to claim 5, wherein when precharging said bit line, after said cut transistor and said bypass transistor are turned on, said cut transistor is turned off earlier than said bypass transistor.

7. The non-volatile semiconductor memory device according to claim 2, wherein said current-voltage converting element is connected to said second transistor at an output node outputting said stored data, and
   said detecting unit further includes a cut transistor connected between said power supply voltage node and said second transistor.

8. The non-volatile semiconductor memory device according to claim 2, wherein said current-voltage converting element is connected to said second transistor at an output node outputting said stored data, and
   said detecting unit further includes a cut transistor connected between said current-voltage converting element and a ground node.

9. A non-volatile semiconductor memory device, comprising:
   a non-volatile memory cell;
   a first bit line corresponding to said memory cell;
   a non-volatile reference cell;
   a second bit line corresponding to said reference cell;
   a first detecting unit including a first current mirror and detecting stored data in said memory cell through said first bit line;
   a second detecting unit including a second current mirror and detecting stored data of said reference cell through said second bit line; and
   a differential amplification unit detecting a difference between an output of said first detecting unit and an output of said second detecting unit to determine the stored data of said memory cell,
   said first detecting unit and said second detecting unit being made to operate at different timings so as to differentiate a precharging period of said first bit line and a precharging period of said second bit line.

10. The non-volatile semiconductor memory device according to claim 9, wherein an operating period of said second current mirror is shorter than an operating period of said first current mirror.

11. The non-volatile semiconductor memory device according to claim 10, wherein
   said first current mirror includes first and second transistors, said second current mirror includes third and fourth transistors, said first detecting unit further includes a fifth transistor connected between gates of said first and second transistors and a first power supply voltage node, and said second detecting unit further includes a sixth transistor connected between gates of said third and fourth transistors and a second power supply voltage node.

12. The non-volatile semiconductor memory device according to claim 10, wherein said differential amplification unit starts an operation between a timing at which said first current mirror starts an operation and a timing at which said second current mirror starts an operation.

13. The non-volatile semiconductor memory device according to claim 9, wherein said differential amplification unit includes a differential amplification circuit outputting a difference between outputs of said first and second detecting units, an output node connected to an outputting node of said differential amplification circuit and outputting the stored data of said memory cell, and a setting circuit connected to said output node and setting an initial state of said output node to a prescribed potential.

14. The non-volatile semiconductor memory device according to claim 13, wherein said initial state is a state of said output node that is obtained when said prescribed said second current mirror operates ahead of said first current mirror.

* * * * *

UNITED STATES PATENT AND TRADEMARK OFFICE
CERTIFICATE OF CORRECTION

PATENT NO.     : 6,504,761 B2                                              Page 1 of 1
DATED          : January 7, 2003
INVENTOR(S)    : Yoshihide Kai et al.

It is certified that error appears in the above-identified patent and that said Letters Patent is hereby corrected as shown below:

<u>Title page, Item [54] and Column 1, line 2,</u>
After "DEVICE" insert -- HAVING --

Signed and Sealed this

Sixteenth Day of September, 2003

JAMES E. ROGAN
*Director of the United States Patent and Trademark Office*